United States Patent
Nakayama et al.

(10) Patent No.: US 8,897,060 B2
(45) Date of Patent: Nov. 25, 2014

(54) MAGNETORESISTANCE EFFECT ELEMENT AND MAGNETIC MEMORY

(75) Inventors: Masahiko Nakayama, Yokohama (JP); Katsuya Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 13/432,626

(22) Filed: Mar. 28, 2012

(65) Prior Publication Data

US 2012/0243305 A1 Sep. 27, 2012

Related U.S. Application Data

(63) Continuation of application No. PCT/JP2009/066774, filed on Sep. 28, 2009.

(51) Int. Cl.
*G11C 11/16* (2006.01)
*H01L 29/82* (2006.01)
*H01L 27/22* (2006.01)
*H01L 43/08* (2006.01)

(52) U.S. Cl.
CPC .............. *H01L 43/08* (2013.01); *H01L 27/228* (2013.01)
USPC ..... 365/158; 365/148; 257/421; 257/E29.323

(58) Field of Classification Search
None
See application file for complete search history.

(56) References Cited

U.S. PATENT DOCUMENTS

| 6,256,223 | B1 | 7/2001 | Sun |
| 7,768,824 | B2 | 8/2010 | Yoshikawa et al. |
| 8,098,514 | B2 | 1/2012 | Nagase et al. |
| 2003/0026048 | A1* | 2/2003 | Yamanaka et al. ......... 360/324.2 |
| 2009/0080238 | A1* | 3/2009 | Yoshikawa et al. ........... 365/158 |

FOREIGN PATENT DOCUMENTS

| JP | 2009-081216 | 4/2009 |
| JP | 2009-081315 | 4/2009 |

OTHER PUBLICATIONS

International Search Report issued Dec. 22, 2009 in PCT/JP2009/066774 filed Sep. 28, 2009.
J.C. Slonczewski; "Current-driven excitation of magnetic multilayers"; Journal of Magnetism and Magnetic Materials, 1996, vol. 159, pp. L1-L7.

* cited by examiner

*Primary Examiner* — James G Norman
(74) *Attorney, Agent, or Firm* — Oblon, Spivak, McClelland, Maier & Neustadt, L.L.P.

(57) ABSTRACT

According to one embodiment, a magnetoresistance effect element includes first and second magnetic layers having an axis of easy magnetization in a direction perpendicular to a film surface, a first nonmagnetic layer formed between the first and second magnetic layers, a first interface magnetic layer formed between the first magnetic layer and the first nonmagnetic layer, and a second nonmagnetic layer formed in the first interface magnetic layer and having an amorphous structure. An electric current flowing through the first magnetic layer, the first nonmagnetic layer, and the second magnetic layer makes a magnetization direction in the first magnetic layer variable.

12 Claims, 9 Drawing Sheets

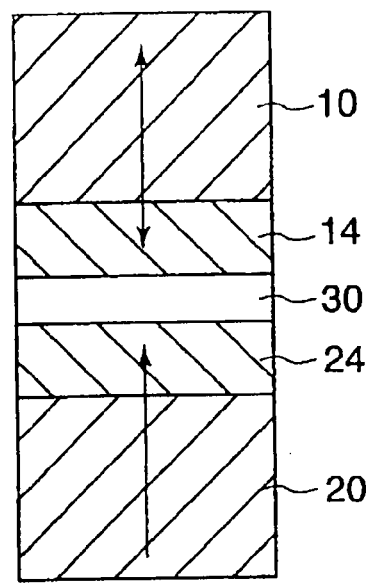
F I G. 1
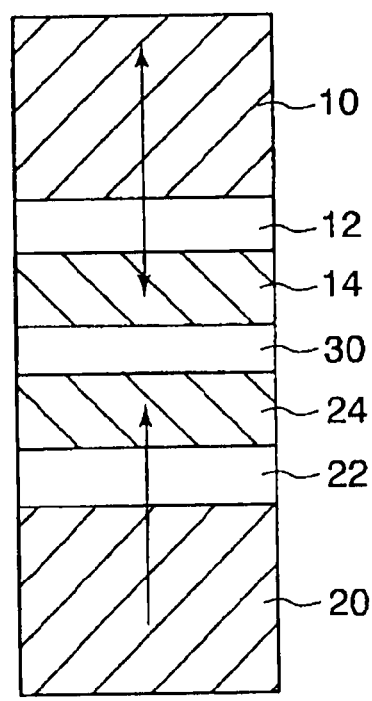
F I G. 2

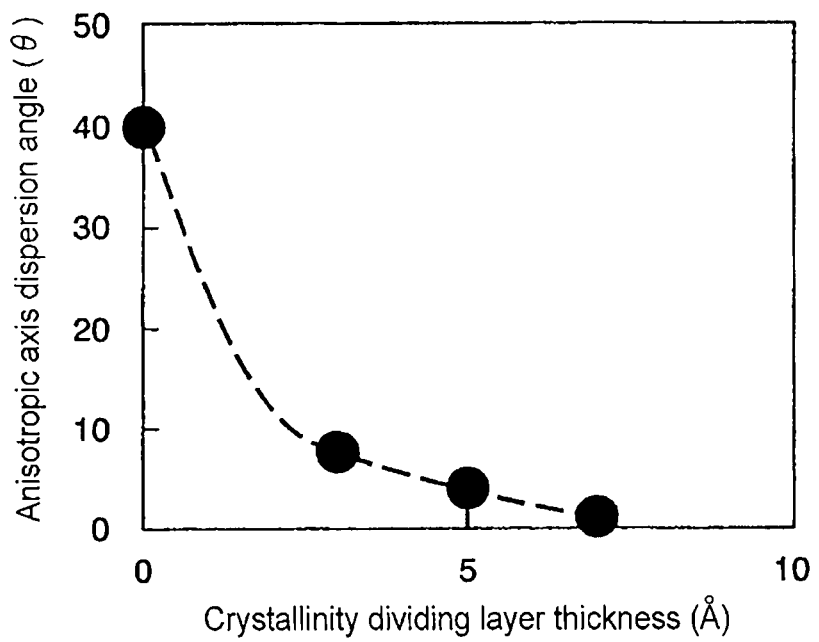
F I G. 9

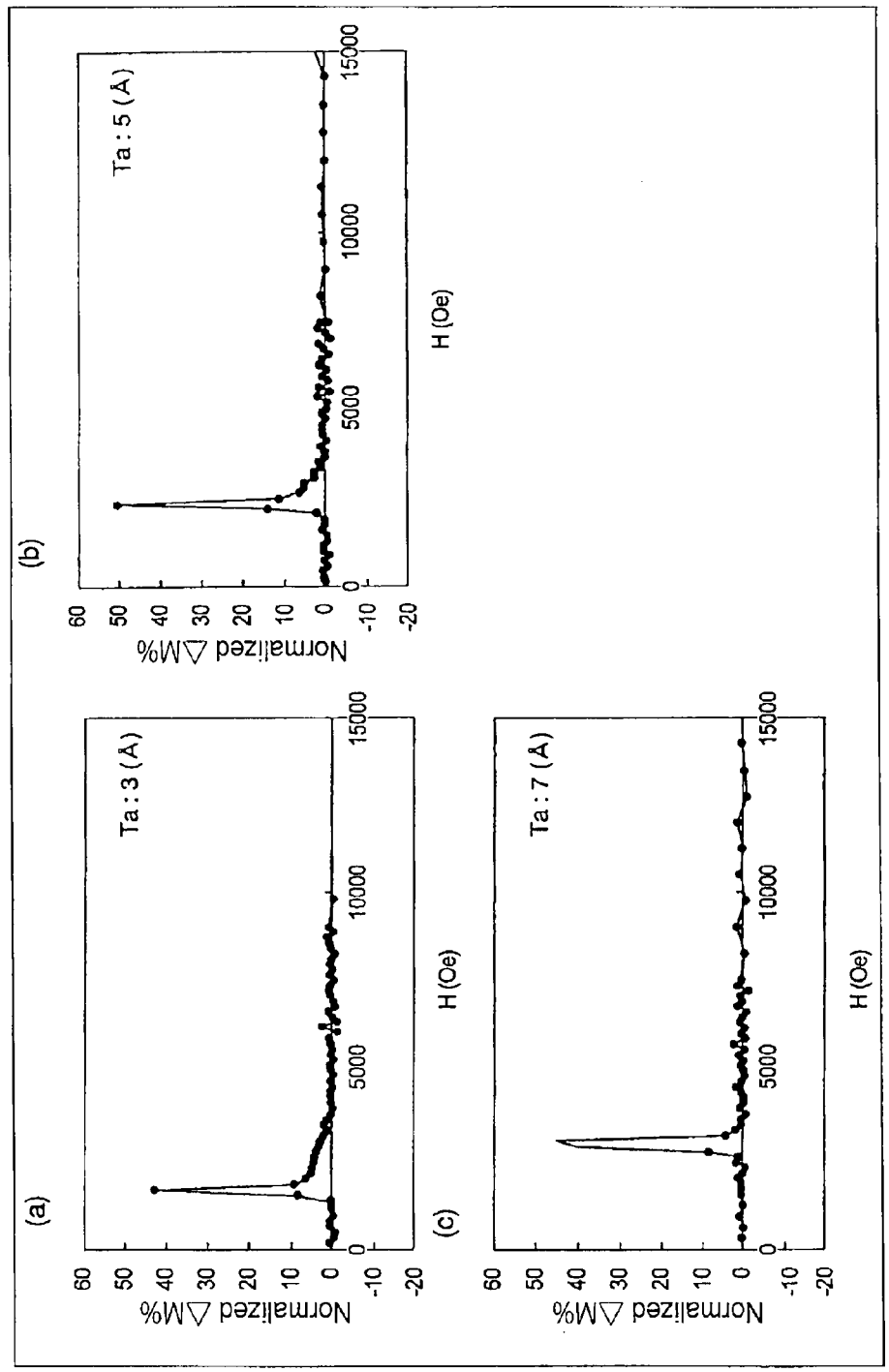
F I G. 10

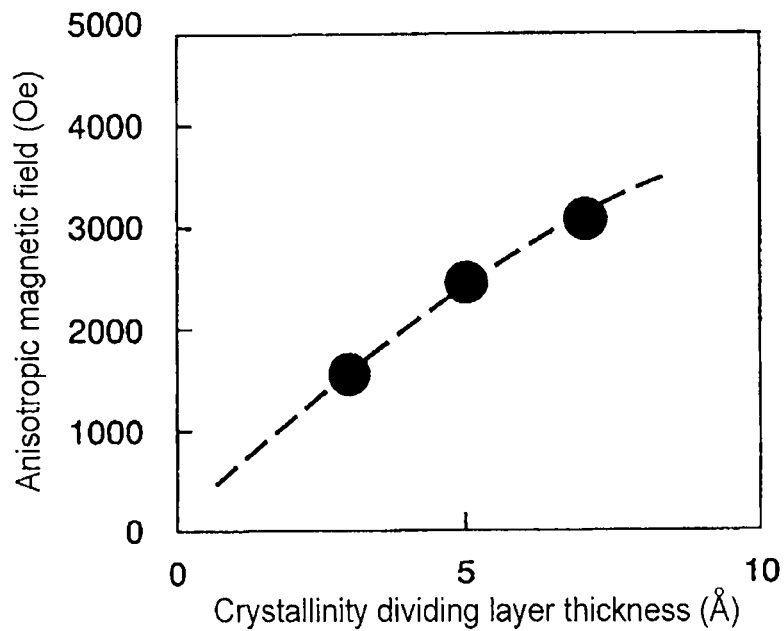
F I G. 11
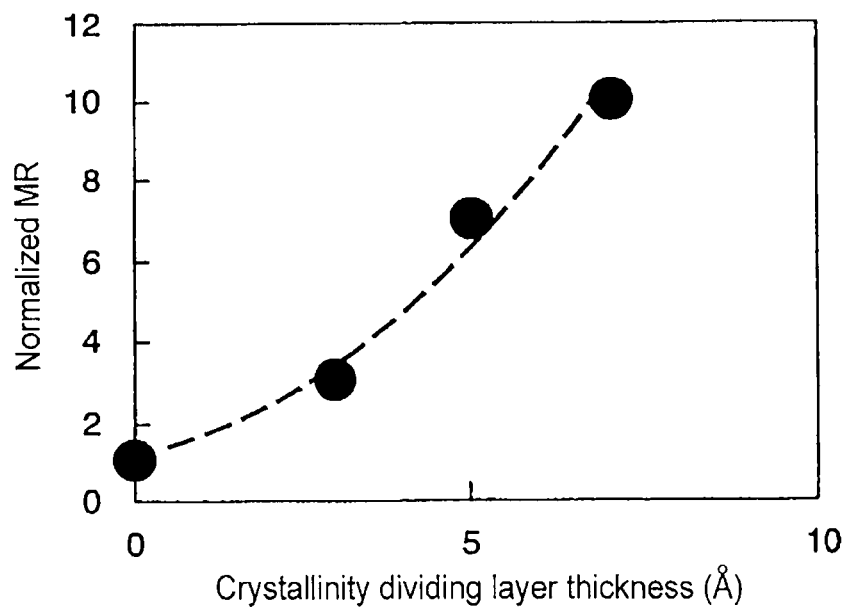
F I G. 12

MAGNETORESISTANCE EFFECT ELEMENT AND MAGNETIC MEMORY

CROSS REFERENCE TO RELATED APPLICATIONS

This application is a Continuation application of PCT Application No. PCT/JP2009/066774, filed Sep. 28, 2009, the entire contents of which are incorporated herein by reference.

FIELD

Embodiments described herein relate generally to a magnetoresistance effect element and a magnetic memory using the magnetoresistance effect element as a memory cell.

BACKGROUND

Recently, a magnetic random access memory (to be referred to as an MRAM hereinafter) using the magnetoresistance effect of a ferromagnetic material is awakening an increasing interest as a next-generation, solid-state nonvolatile memory having a high read/write speed and large capacity and capable of a low-power-consumption operation. In particular, a magnetoresistance effect element having a magnetic tunnel junction (to be referred to as an MTJ hereinafter) has attracted attention since the element was found to have a high magnetoresistance change ratio.

The MTJ basically has a three-layered structure including a storage layer having a variable magnetization direction, an insulator layer, and a reference layer maintaining a predetermined magnetization direction. When an electric current is supplied to this MTJ, the electric current flows by tunneling through the insulator layer. In this state, the resistance of the junction portion changes in accordance with the relative angle between the magnetization directions of the storage layer and reference layer. For example, the resistance takes a minimal value when the magnetization directions are parallel, and a maximal value when they are antiparallel. This resistance change is called a tunneling magneto-resistance effect (to be referred to as a TMR effect hereinafter). When using a magnetoresistance effect element having the MTJ as a memory cell, information is stored by making the parallel and antiparallel states of magnetization in the storage layer and reference layer (i.e., the minimal and maximal of the resistance) correspond to "0" and "1" of binary information. Note that the parallel and antiparallel states of magnetization may also be made to correspond to "1" and "0" of binary information.

As a method of writing information in the magnetoresistance effect element, a magnetic field writing method is known in which a write wiring is formed near a memory cell and only the magnetization direction in the storage layer is reversed by a current magnetic field generated when an electric current flows. When the element size is decreased in order to implement a large-capacity memory, however, the coercive force (Hc) of a magnetic material forming the storage layer increases in principle, so an electric current necessary for write increases as the element is downsized. On the other hand, the current magnetic field from the write wiring decreases in principle as the cell size decreases. In the magnetic field writing method, therefore, it is difficult to achieve both the downsizing of a cell required for large-capacity design and the reduction in write current.

On the other hand, as a write method of solving this problem, a writing (spin transfer torque writing) method using spin-momentum-transfer (SMT) has recently been proposed. This method reverses the magnetization direction in the storage layer by supplying a spin polarization current to the magnetoresistance effect element. In addition, the smaller the volume of a magnetic layer forming the storage layer, the smaller the amount of spin-polarized electrons to be injected. Accordingly, the method is expected as a writing method capable of achieving both the downsizing of an element and a low electric current.

When downsizing an element in order to achieve a large capacity, however, the energy barrier for maintaining the magnetization direction in the storage layer in one direction, i.e., the magnetic anisotropic energy becomes smaller than the thermal energy. Consequently, the problem that the magnetization direction of the magnetic material fluctuates (a thermal disturbance) and stored information cannot be maintained any longer becomes conspicuous.

The energy barrier required to reverse the magnetization direction is generally represented by the product of a magnetic anisotropy constant (the magnetic anisotropic energy per unit volume) and a magnetization reversal unit volume. To ensure a resistance to the thermal disturbance in a fine-element-size region, therefore, it is necessary to select a material having a large magnetic anisotropy constant. In-plane magnetization type arrangements mainly examined up to date generally use magnetic shape anisotropy. To increase the magnetic anisotropic energy in this case, it is necessary to, e.g., increase the aspect ratio of the magnetoresistance effect element, increase the film thickness of the storage layer, or increase the saturation magnetization of the storage layer. When the features of the spin transfer torque writing method are taken into consideration, however, all of these measures increase a reversal current and hence are unsuitable for downsizing.

On the other hand, it is also possible to use a material having high magnetocrystalline anisotropy instead of the magnetic shape anisotropy. In this case, however, the axis of easy magnetization in the in-plane direction largely disperses in the film surface. This decreases the MR ratio (Magnetoresistance ratio), and as a consequence the reversal current increases. Accordingly, this measure is also unfavorable. Furthermore, since the in-plane magnetization type arrangement uses magnetic anisotropy that appears in accordance with the shape, the reversal current is sensitive to the variation in shape. Consequently, the variation in reversal current may increase with the advance of downsizing.

By contrast, a so-called perpendicular magnetization magnetic film having the axis of easy magnetization in a direction perpendicular to the film surface can be used as a ferromagnetic material forming the magnetoresistance effect element. When using magnetocrystalline anisotropy in this perpendicular magnetization type arrangement, the element size can be made smaller than that of the in-plane magnetization type arrangement because no shape anisotropy is used. In addition, the dispersion in the direction of easy magnetization can be decreased. Accordingly, the use of a material having high magnetocrystalline anisotropy is expected to achieve both downsizing and a low electric current while maintaining the thermal disturbance resistance.

Examples of a material system for use in the perpendicular magnetization film are an $L1_0$ or $L1_1$ ordered alloy system (e.g., FePt and CoPt), an artificial lattice system (Co/Pt and Pd), an hcp system (e.g., CoPt), and an RE-TM system (e.g., Tb—CoFe).

The reversal current for reversing magnetization by the spin transfer torque writing method generally depends on saturation magnetization Ms and a magnetic damping constant α of the storage layer. To reverse the magnetization of the storage layer by the spin transfer torque of a low electric current, therefore, it is important to decrease the saturation magnetization Ms and magnetic damping constant α. Also, a device must resist the processing temperature. However, the MTJ is generally formed by a multilayered structure of a plurality of metal films. During an element fabrication process including annealing, therefore, the structure changes in the interface between different types of metals, and the magnetic characteristics readily deteriorate. Accordingly, there is no material that satisfies all of the above-mentioned characteristics necessary for the perpendicular magnetization film as a storage layer.

BRIEF DESCRIPTION OF THE DRAWINGS

FIG. 1 is a view showing the structure of a general magnetoresistance effect element.

FIG. 2 is a sectional view showing a magnetoresistance effect element according to the first embodiment.

FIG. 9 is a graph showing the dependence of the anisotropic axis dispersion angle of the magnetoresistance effect element according to the first embodiment on the film thickness of a crystallinity dividing layer.

FIG. 10 shows graphs of the anisotropic magnetic field dispersion of the magnetoresistance effect element according to the first embodiment.

FIG. 11 is a graph showing the dependence of the anisotropic magnetic field of the magnetoresistance effect element according to the first embodiment on the film thickness of the crystallinity dividing layer.

FIG. 12 is a graph showing the dependence of the magnetoresistance effect of the magnetoresistance effect element according to the first embodiment on the film thickness of the crystallinity dividing layer.

DETAILED DESCRIPTION

Figure 3:
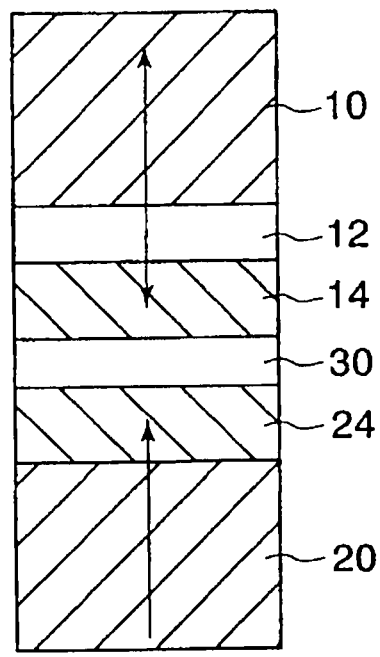
FIG. 3 is a sectional view showing a magnetoresistance effect element according to the first modification of the first embodiment.

In general, according to one embodiment, a magnetoresistance effect element comprising a first magnetic layer having an axis of easy magnetization in a direction perpendicular to a film surface; a second magnetic layer having an axis of easy magnetization in a direction perpendicular to a film surface; a first nonmagnetic layer formed between the first magnetic layer and the second magnetic layer, an electric current flowing through the first magnetic layer, the first nonmagnetic layer, and the second magnetic layer making a magnetization direction in the first magnetic layer variable; a first interface magnetic layer formed between the first magnetic layer and the first nonmagnetic layer; and a second nonmagnetic layer formed in the first interface magnetic layer and having an amorphous structure.

According to other embodiment, a magnetic memory comprising a magnetoresistance effect element; a first electrode and a second electrode configured to supply an electric current to the magnetoresistance effect element; a first wiring electrically connected to the first electrode; a second wiring electrically connected to the second electrode; and a write circuit which is electrically connected to the first wiring and the second wiring; and bidirectionally supplies an electric current to the magnetoresistance effect element, and the magnetoresistance effect element comprising a first magnetic layer having an axis of easy magnetization in a direction perpendicular to a film surface; a second magnetic layer having an axis of easy magnetization in a direction perpendicular to a film surface; a first nonmagnetic layer formed between the first magnetic layer and the second magnetic layer, an electric current flowing through the first magnetic layer, the first nonmagnetic layer, and the second magnetic layer making a magnetization direction in the first magnetic layer variable; a first interface magnetic layer formed between the first magnetic layer and the first nonmagnetic layer; and a second nonmagnetic layer formed in the first interface magnetic layer and having an amorphous structure.

Embodiments will be explained below with reference to the accompanying drawings.

First, the structure and problem of a general magnetoresistance effect element will be explained before the explanation of the embodiments.

(1) Structure of General Magnetoresistance Effect Element

FIG. 1 shows a general structure of a magnetoresistance effect element using a perpendicular magnetization magnetic film. The perpendicular magnetization magnetic film herein mentioned means a magnetic film having a magnetization direction almost perpendicular to the film surface, and the film surface means the upper surface. That is, the perpendicular magnetization magnetic film has the axis of easy magnetization almost perpendicular to the film surface. This magnetoresistance effect element includes a storage layer 10, a reference layer 20, and a nonmagnetic layer 30 formed between the storage layer and reference layer.

In the storage layer 10, the direction of magnetization (or spin) reverses when the spin momentum of spin-polarized electrons generated by supplying an electric current to the magnetoresistance effect element in a direction perpendicular to the film surface is transferred to electrons in the storage layer 10. That is, the magnetization direction in the storage layer 10 varies in accordance with the direction of an electric current. By contrast, the magnetization direction in the reference layer 20 is invariable. "The magnetization direction is invariable" means that the magnetization direction in the reference layer 20 does not reverse when a magnetization reversing current for reversing the magnetization direction in the storage layer 10 is supplied to the magnetoresistance effect element. In an actual operation, information is written by using the change in resistance by the TMR effect when the magnetization direction in the storage layer 10 is changed.

To achieve a TMR effect exceeding 100% in the magnetoresistance effect element using the perpendicular magnetization magnetic film, it is generally preferable to form an interface magnetic layer having high polarizability between the perpendicular magnetization magnetic film and nonmagnetic layer. That is, as shown in FIG. 1, an interface magnetic layer 14 is formed between the storage layer 10 and nonmagnetic layer 30, and an interface magnetic layer 24 is formed between the reference layer 20 and nonmagnetic layer 30. Note that the interface magnetic layers are formed between the storage layer 10 and nonmagnetic layer 30 and between the reference layer 20 and nonmagnetic layer 30 in FIG. 1, but the interface magnetic layer may also be formed at least between the storage layer 10 and nonmagnetic layer 30 or between the reference layer 20 and nonmagnetic layer 30. A material forming the interface magnetic layer must be selected so that the nonmagnetic layer and interface magnetic layer have the same crystal structure and very close lattice constants. As a material showing this characteristic, an in-plane magnetization magnetic film such as Fe, Co, CoFe, or CoFeB is used as the interface magnetic layer. Even when using this in-plane magnetization magnetic film as the interface magnetic layer, exchange coupling acts between the perpendicular magnetization magnetic layer and interface magnetic layer, and the perpendicular magnetic anisotropy is high, so magnetization in the interface magnetic layer also points in the direction perpendicular to the film surface.

(2) Problem of Magnetoresistance Effect Element

The problem of the magnetoresistance effect element having the arrangement shown in FIG. 1 is that the crystallinities of the interface magnetic layer and perpendicular magnetization magnetic layer change in an actual element fabrication process or annealing step. It is normally difficult to completely match the crystal structures, crystal orientations, and lattice constants of the interface magnetic layer and perpendicular magnetization magnetic layer. For example, when heat is applied to a metal junction using at least two types of metal films having different structures, these metal films affect mutual atomic arrangements and change the original crystallinities. This change increases the mismatch between the crystal structure of the interface magnetic layer used in the magnetoresistance effect element and that of the nonmagnetic layer, and may suppress the TMR effect. Also, when the crystallinity of the perpendicular magnetization layer changes, the anisotropic axis of perpendicular magnetization varies, or the perpendicular magnetic anisotropic energy deteriorates. This may make it impossible to obtain desired storage characteristics.

Accordingly, the present inventors made extensive studies, and was able to obtain a magnetoresistance effect element capable of solving the above-described problem, even when the crystal structures, crystal orientations, and lattice constants of the interface magnetic layer and perpendicular magnetization magnetic layer are different. This will be explained below as embodiments.

(First Embodiment)

FIG. 2 shows a magnetoresistance effect element according to the first embodiment. A magnetoresistance effect element 1 of this embodiment has an arrangement in which crystallinity dividing layers 12 and 22 having an amorphous structure are formed between perpendicular magnetization magnetic layers and interface magnetic layers. That is, the magnetoresistance effect element 1 of this embodiment includes a storage layer 10 having an axis of easy magnetization almost perpendicular to the film surface and a variable magnetization direction, the nonmagnetic crystallinity dividing layer 12, an interface magnetic layer 14, a nonmagnetic layer 30, an interface magnetic layer 24, the nonmagnetic crystallinity dividing layer 22, and a reference layer 20 having an axis of easy magnetization almost perpendicular to the film surface and an invariable magnetization direction. Referring to FIG. 2, the storage layer 10, crystallinity dividing layer 12, interface magnetic layer 14, nonmagnetic layer 30, interface magnetic layer 24, crystallinity dividing layer 22, and reference layer 20 are stacked in this order from above. However, a multilayered structure in which these layers are stacked in the reverse order may also be formed. That is, in this case, the storage layer 10, crystallinity dividing layer 12, interface magnetic layer 14, nonmagnetic layer 30, interface magnetic layer 24, crystallinity dividing layer 22, and reference layer 20 are stacked in this order from below.

This embodiment has the structure in which the crystallinity dividing layer 12 is formed between the storage layer 10 and interface magnetic layer 14, and the crystallinity dividing layer 22 is formed between the reference layer 20 and interface magnetic layer 24. In this structure, if the crystallinity dividing layers 12 and 22 can maintain the amorphous structure even after an annealing step is performed, it is possible to suppress deterioration of the crystallinity between the storage layer 10 and interface magnetic layer 14, and between the reference layer 20 and interface magnetic layer 24. That is, the crystallinity dividing layer is formed between the interface magnetic layer and perpendicular magnetization magnetic layer, and prevents the interface magnetic layer and perpendicular magnetization magnetic layer from affecting mutual atomic arrangements and changing their crystallinities, in order to prevent deterioration of the magnetoresistance effect and magnetic anisotropic energy. Accordingly, the crystallinity dividing layer divides the crystallinity between the interface magnetic layer and perpendicular magnetization magnetic layer. This effect allows the interface magnetic layer to hold crystallinity required to raise the TMR effect, and the storage layer 10 and reference layer 20 to hold crystallinity required to have sufficient perpendicular magnetic anisotropy. That is, it is possible to obtain a thermally stable spin transfer torque writing type magnetoresistance effect element having a high heat resistance. Also, if the film thickness of the crystallinity dividing layer becomes too large, exchange coupling between the interface magnetic layer and perpendicular magnetization magnetic layer weakens, and it becomes difficult to hold the magnetization direction in the interface magnetic layer perpendicular to the film surface. Therefore, the film thickness is desirably about 10 Å or less.

Figure 4:
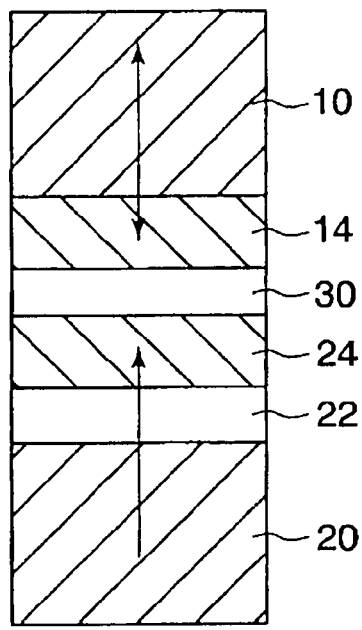
FIG. 4 is a sectional view showing a magnetoresistance effect element according to the second modification of the first embodiment.

Furthermore, the effect of the crystallinity dividing layer can be obtained even in an arrangement in which the crystallinity dividing layer 12 is formed only between the storage layer 10 and interface magnetic layer 14 as in the first modification shown in FIG. 3, or an arrangement in which the crystallinity dividing layer 22 is formed only between the reference layer 20 and interface magnetic layer 24 as in the second modification shown in FIG. 4.

Figure 5:
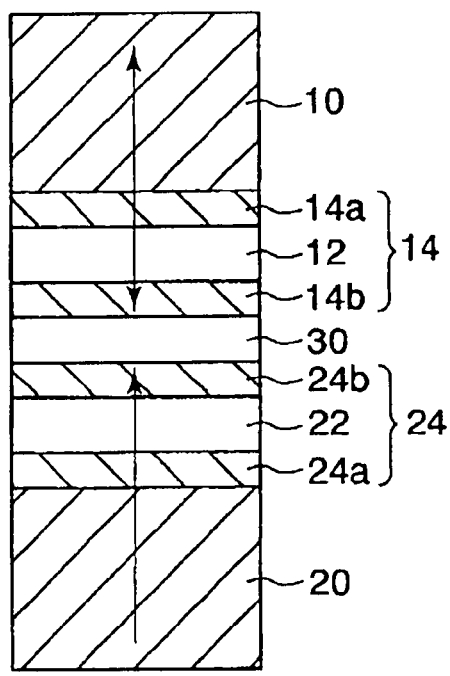
FIG. 5 is a sectional view showing a magnetoresistance effect element according to the third modification of the first embodiment.
Figure 6:
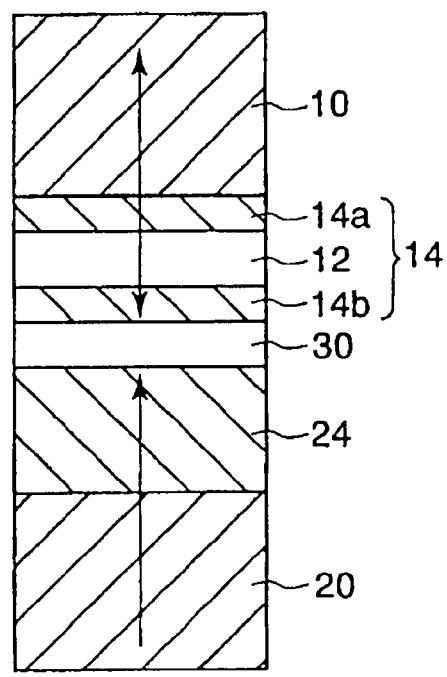
FIG. 6 is a sectional view showing a magnetoresistance effect element according to the fourth modification of the first embodiment.
Figure 7:
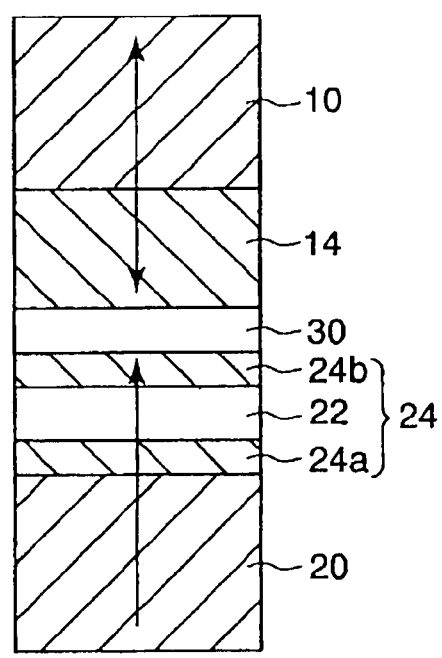
FIG. 7 is a sectional view showing a magnetoresistance effect element according to the fifth modification of the first embodiment.

Also, as shown in FIGS. 5, 6, and 7, the crystallinity dividing layer may also be formed in the interface magnetic layer. The magnetoresistance effect element 1 according to the third embodiment shown in FIG. 5 has an arrangement in which the crystallinity dividing layers 12 and 22 are respectively formed in the interface magnetic layers 14 and 24 in the magnetoresistance effect element 1 of the first embodiment shown in FIG. 1. That is, the crystallinity dividing layer 12 divides the interface magnetic layer 14 into a first interface magnetic layer 14a and second interface magnetic layer 14b, and the crystallinity dividing layer 22 divides the interface magnetic layer 24 into a first interface magnetic layer 24a and second interface magnetic layer 24b.

The magnetoresistance effect element 1 of the fourth modification shown in FIG. 6 has an arrangement in which the crystallinity dividing layer 12 is formed in the interface magnetic layer 14 in the magnetoresistance effect element 1 according to the first modification shown in FIG. 3. That is, the crystallinity dividing layer 12 divides the interface magnetic layer 14 into a first interface magnetic layer 14a and second interface magnetic layer 14b.

Also, the magnetoresistance effect element 1 of the fifth modification shown in FIG. 7 has an arrangement in which the crystallinity dividing layer 22 is formed in the interface magnetic layer 24 in the magnetoresistance effect element 1 according to the second modification shown in FIG. 4. That is, the crystallinity dividing layer 22 divides the interface magnetic layer 24 into a first interface magnetic layer 24a and second interface magnetic layer 24b.

Note that the interface magnetic layers are formed between the storage layer 10 and nonmagnetic layer 30 and between the reference layer 20 and nonmagnetic layer 30 in this embodiment and its modifications, but the interface magnetic layer may also be formed at least between the storage layer 10 and nonmagnetic layer 30 or between the reference layer 20 and nonmagnetic layer 30. In this case, the crystallinity dividing layer is formed between the interface magnetic layer and the perpendicular magnetization magnetic layer on that side of the interface magnetic layer, which is opposite to the nonmagnetic layer 30, or in the interface magnetic layer.

Figure 8:
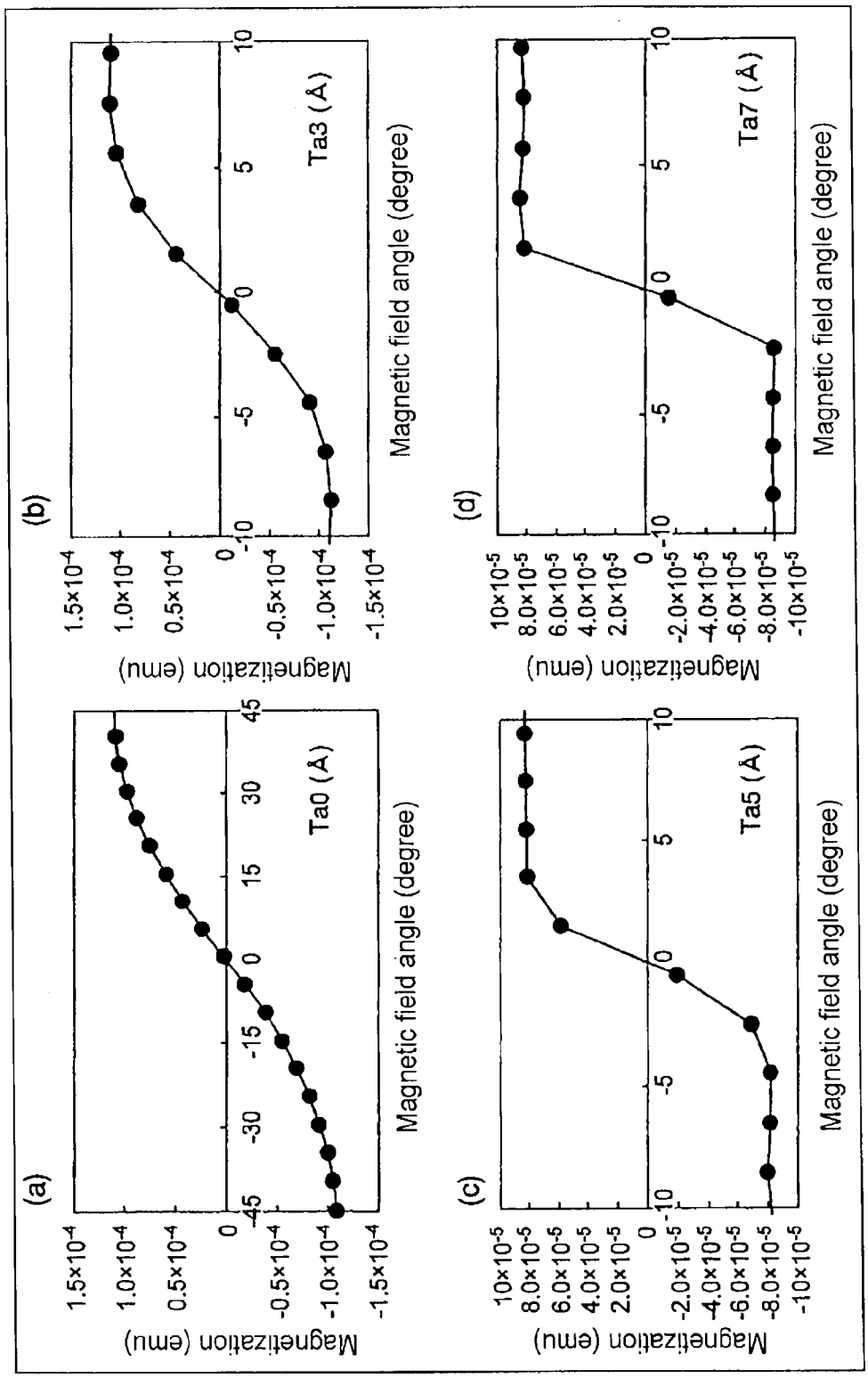
FIG. 8 shows graphs of the dependence of the residual magnetization of the magnetoresistance effect element according to the first embodiment on the applied magnetic field angle.

Then, a magnetic multilayered film is prepared by using a perpendicular magnetization magnetic layer made of a Co/Pd artificial lattice as the storage layer 10, CoFeB as the interface magnetic layer 14, and an amorphous Ta layer having a film thickness of 3, 5, or 7 Å as the crystallinity dividing layer 12. FIGS. 8(a), 8(b), 8(c), and 8(d) show the measurement results of the anisotropic axis dispersion after this magnetic multilayered film was annealed at 350° C. for 30 min. FIG. 8(a) shows the measurement result when the film thickness of the crystallinity dividing layer 12 was 0 Å, i.e., when no crystallinity dividing layer was inserted, and FIGS. 8(b), 8(c), and 8(d) respectively show the measurement results when the film thicknesses of the crystallinity dividing layers 12 were 3, 5, and 7 Å. The anisotropic axis dispersion was evaluated by measuring the residual magnetization by changing an applied magnetic field angle, with a vibrating sample magnetometer capable of generating a biaxial vector magnetic field. Referring to FIGS. 8(a), 8(b), 8(c), and 8(d), the anisotropic axis dispersion angle is defined as an angle at which the dependence of the residual magnetization on the angle saturates.

FIG. 9 shows the dependence of the anisotropic axis dispersion angle on the film thickness of the crystallinity dividing layer. As shown in FIG. 9, the magnetic anisotropic axis dispersion of the storage layer 10 can be suppressed by clearly inserting the crystallinity dividing layer, and the dispersion angle can be decreased to 10% or less by inserting Ta by only about 3 Å. The dispersion angle can further be decreased to 2% or less by inserting Ta by 7 Å. These results indicate that the crystallinity dividing layer makes it possible to suppress the crystallinity deterioration of the perpendicular magnetization magnetic layer even after annealing, suppress the variation in anisotropic axis, and provide a multilayered structure suitable for a magnetoresistance effect element that varies the characteristics little when processed.

FIGS. 10(a), 10(b), and 10(c) show the results of evaluation of the anisotropic magnetic field dispersion. In a perpendicular magnetization magnetic layer, the anisotropic magnetic field generally has finite dispersion even in the film by reflecting, e.g., the crystal grain distribution inside the film. Referring to FIGS. 10(a), 10(b), and 10(c), the abscissa indicates an external magnetic field, and the ordinate indicates a normalized dispersion ΔM of the anisotropic magnetic field. That is, FIGS. 10(a), 10(b), and 10(c) each show the ratio of a region having the anisotropic magnetic field in each magnetic film. FIGS. 10(a), 10(b), and 10(c) clearly indicate that the peak width of the dispersion of the anisotropic magnetic field decreases as the film thickness of the crystallinity dividing layer increases. This result demonstrates that the variation in anisotropic magnetic field of the magnetic layer is suppressed.

FIG. 11 shows the dependence of the peak value of the anisotropic magnetic field, i.e., the typical value of the anisotropic magnetic field of each magnetic field on the film thickness of the crystallinity dividing layer. As shown in FIG. 11, the anisotropic magnetic field rises as the film thickness of the crystallinity dividing layer increases. This result shows that the deterioration of the perpendicular magnetic anisotropy can be suppressed by inserting the crystallinity dividing layer, and indicates the effects of the magnetoresistance effect elements of this embodiment and modifications.

To check the effect of the crystallinity dividing layer on the interface magnetic layer, the magnetoresistance effect element of this embodiment shown in FIG. 2 was formed by using a perpendicular magnetization film having a Co/Pt artificial lattice as the perpendicular magnetization magnetic layers as the storage layer and reference layer, CoFeB as the interface magnetic layer, amorphous Ta as the crystallinity dividing layer, and MgO as the nonmagnetic layer. The TMR effect was measured after annealing was performed at 350° C. for 30 min. FIG. 12 shows the dependence of the TMR effect on the film thickness of the crystallinity dividing layer. When normalization was performed by assuming that the TMR effect after annealing was performed with no crystallinity dividing layer was 1, the TMR effect increased by about 10 times by forming the crystallinity dividing layer. This result clearly reveals that the crystallinity of the interface magnetic layer was held to lattice-match with MgO and an effectively high polarizability was obtained by the effect of the crystallinity dividing layer.

Next, the material of the crystallinity dividing layer will be explained. The crystallinity dividing layer of the magnetoresistance effect element according to the first embodiment desirably has an amorphous structure. Examples of the material of the crystallinity dividing layer are niobium (Nb), silicon (Si), tantalum (Ta), and zirconium (Zr). An alloy containing at least one element selected from the group consisting of niobium (Nb), silicon (Si), tantalum (Ta), and zirconium (Zr) is also a favorable material. Each of these amorphous layers shows no clear crystal structure when formed. In each amorphous layer, however, crystallization may partially begin in an annealing step after deposition, and a given region may exhibit a clear crystal structure. That is, when the amorphous layer is finally functioning as a device, the layer can partially have a crystal structure. The film thickness of the crystallinity dividing layer is desirably 3 to 10 Å because if this film thickness is too large, exchange coupling between the interface magnetic layer and perpendicular magnetization magnetic layer (storage layer or reference layer) weakens.

The material of the nonmagnetic layer will now be explained. The material of the nonmagnetic layer of the magnetoresistance effect element according to the first embodiment is preferably an oxide having an NaCl structure. Practical examples are MgO, CaO, SrO, TiO, VO, and NbO. When crystals of these NaCl-structure oxides are grown on an alloy containing at least one element selected from the group consisting of Fe, Co, and Ni as a main component, e.g., an amorphous CoFeNiB alloy, or on FeCoNi having a body-centered cubic (BCC) structure and a (100) preferred alignment plane, the crystals easily grow on the (100) plane as a preferred alignment plane. Especially on a CoFe—X amorphous alloy to which B, C, or N is added, it is very easily possible to preferentially align the (100) plane. X indicates an additive element such as B, C, or N. Also, when crystals of the above-mentioned, NaCl-structure oxide are grown on the (002) plane of an alloy having a $DO_{22}$ structure containing at least one element selected from the group consisting of Fe, Co, and Ni as a main component, or on the (001) plane of an $L1_0$ ordered alloy having an FCT structure, the crystals readily grow on the (100) plane as a preferred alignment plane.

When the magnetization directions in the storage layer and reference layer are antiparallel, a spin-polarized Δ1 band dominates tunnel conduction, so only majority spin electrons contribute to the conduction. Consequently, the magnetoresistance effect element decreases the conductivity and increases the resistance value. By contrast, when the magnetization directions in the storage layer and reference layer are parallel, a Δ5 band that is not spin-polarized dominates the conduction, so the magnetoresistance effect element 1 increases the conductivity and decreases the resistance value. Accordingly, the formation of the Δ1 band is important to achieve a high TMR. To form the Δ1 band, the (100) plane of the nonmagnetic layer made of the NaCl-structure oxide must well match with the interface between the storage layer and reference layer. It is more preferable to select, as the interface magnetic layer, a material by which lattice mismatch with the (100) plane of the nonmagnetic layer is 5% or less.

The material of the perpendicular magnetization magnetic layer will be explained below. As the perpendicular magnetization magnetic layers, i.e., the storage layer and reference layer of the magnetoresistance effect element according to the first embodiment, it is preferable to select a material holding the magnetization direction perpendicular to the film surface and having sufficient retention characteristics, and the following materials are used.

(a) Magnetic Alloy Systems

First, magnetic alloy-based materials will be explained. The magnetic alloy-based materials include two kinds of materials, i.e., an ordered alloy system and random alloy system. Either alloy can be used as the perpendicular magnetization magnetic layer of the first embodiment by selecting constituent elements.

The ordered alloy is an alloy containing one or more elements selected from Fe, Co, and Ni, and one or more elements selected from platinum (Pt), palladium (Pd), ruthenium (Ru), iridium (Ir), and gold (Au). The crystal structure of this ordered alloy is the $L1_0$ or $L1_1$ structure. Examples are $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. These ordered alloys are not limited to the above-mentioned composition ratios. The effective magnetic anisotropic energy and saturation magnetization can be adjusted by adding, to these ordered alloys, impurity elements such as Cu (copper), Cr (chromium), and Ag (silver) or alloys of these elements, and insulators.

An example of the random alloy is an alloy containing one or more elements selected from Fe, Co, and Ni, and one or more elements selected from Pt, Pd, Cr, Ta, Nb, vanadium (V), tungsten (W), hafnium (Hf), titanium (Ti), and Zr. Examples are a CoPt alloy, CoPd alloy, CoCr alloy, FeCr alloy, CoCrPa alloy, CoCrPt alloy, CoCrPtTa alloy, and CoCrNb alloy. The effective magnetic anisotropic energy and saturation magnetization of these alloys can be adjusted by increasing the ratio of the nonmagnetic element.

(b) Artificial Lattice System

The material of the artificial lattice system will be explained below. The artificial lattice is a structure obtained by alternately stacking one element selected from Fe, Co, and Ni or an alloy containing one or more of these elements, and one element selected from Cr, Pt, Pd, Ir, Rh, Ru, Os, Re, Au, and Cu or an alloy containing one or more of these elements. Examples are a Co/Pt artificial lattice, a Co/Pd artificial lattice, a CoCr/Pt artificial lattice, a Co/Ru artificial lattice, Co/Os, Co/Au, and an Ni/Cu artificial lattice. These artificial lattices normally have a tetragonal or hexagonal crystal structure. In these artificial lattices, the effective magnetic anisotropic energy and saturation magnetization of tetragonal these artificial lattices can normally be adjusted by adding elements to the magnetic layer, and adjusting the film thickness ratio of the magnetic layer to the nonmagnetic layer and the stacking period.

The interface magnetic layer material will be explained below.

The storage layer and reference layer of the magnetoresistance effect element according to the first embodiment require the interface magnetic layer in order to raise the TMR effect. The interface magnetic layer is preferably made of a high-polarizability material, practically, an alloy containing one of Fe, Co, and Ni and one of B and Ta, or an alloy $(Co_{100-x}-Fe_x)_{100-y}B_y$ (x≥20 at %, 0<y≤30 at %) containing Co, Fe, and B. A CoFe alloy or Fe is also favorable as the interface magnetic layer. These magnetic materials desirably have a cubic or tetragonal crystal structure, and match with the crystal orientation of the nonmagnetic layer, e.g., align in the (100) plane of the nonmagnetic layer. When using these magnetic materials as the interface magnetic layer, lattice mismatch between the interface magnetic layer and nonmagnetic layer is reduced. In addition, the effect of achieving a high TMR and high spin injection efficiency are expected because the materials are high-polarizability materials. These magnetic layers may not show any clear crystal structure when formed, but they need only start crystallizing upon annealing after deposition, and exhibit a cubic crystal structure when finally functioning as a device.

As has been described above, the first embodiment can provide a high-heat-resistance magnetoresistance effect element that does not deteriorate the magnetic characteristics and output characteristics even after a high-temperature annealing process at 300° C. or more. That is, a thermally stable spin transfer torque writing type magnetoresistance effect element having a high heat resistance can be obtained.

(Second Embodiment)

A magnetic memory (MRAM) according to the second embodiment will be explained below with reference to FIGS. 13 and 14.

Figure 13:
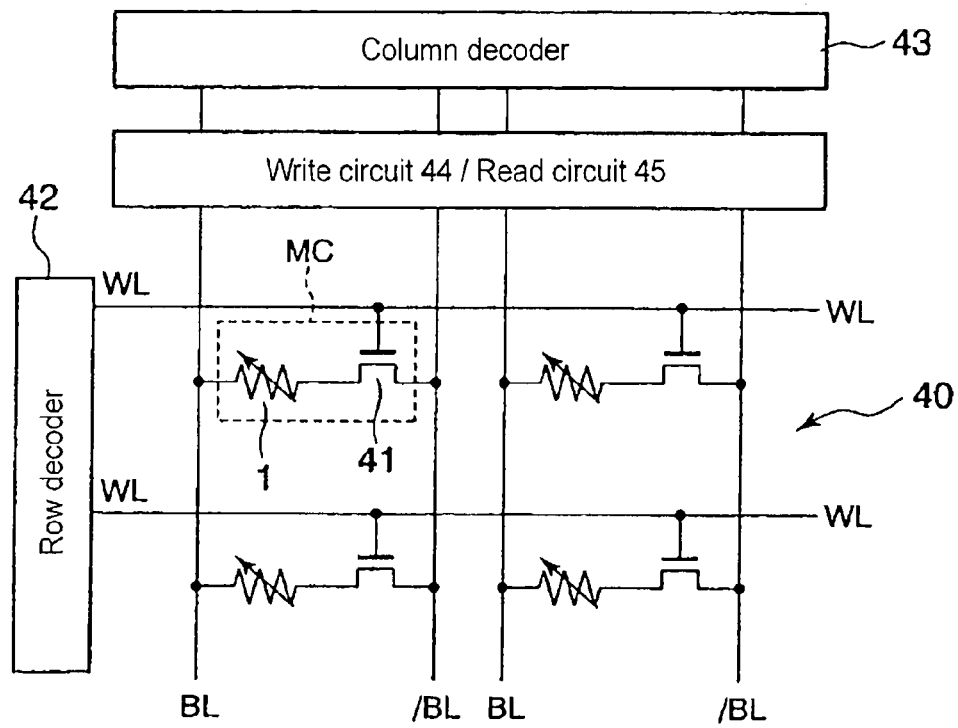
FIG. 13 is a circuit diagram showing a magnetic memory of the second embodiment.
Figure 14:
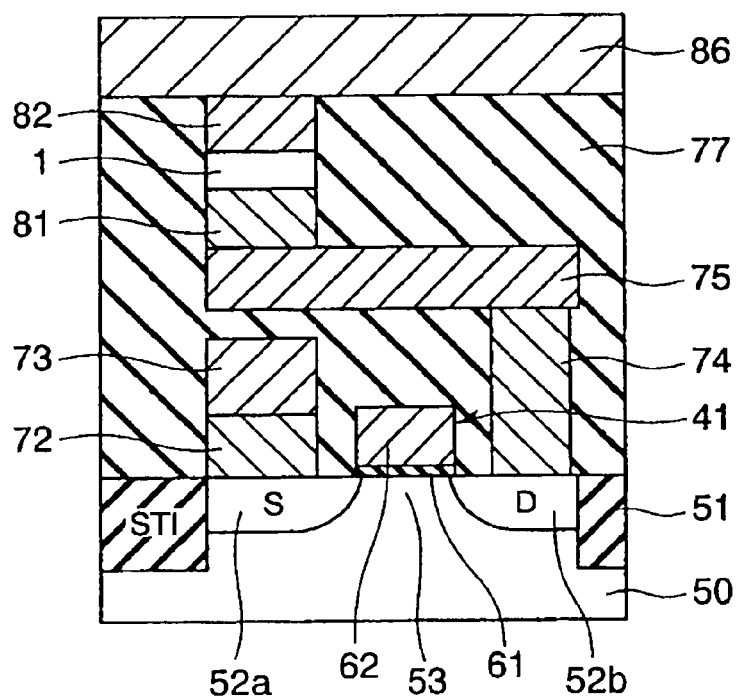
FIG. 14 is a sectional view of a memory cell of the magnetic memory according to the second embodiment.

FIG. 13 show a circuit diagram of the MRAM of this embodiment. The MRAM of this embodiment uses the magnetoresistance effect element 1 explained in the first embodiment and the modifications of the first embodiment as a memory element of a memory cell. This MRAM includes a memory cell array 40 including a plurality of memory cells MC arranged in a matrix. In the memory cell array 40, a plurality of bit line pairs BL and /BL run in the column direction, and a plurality of word lines WL run in the row direction.

The memory cells MC are arranged at the intersections of the bit lines BL and word lines WL. Each memory cell MC includes the magnetoresistance effect element 1, and a selection transistor 41 made of an n-channel MOS transistor. One terminal of the magnetoresistance effect element 1 is connected to the bit line BL. The other terminal of the magnetoresistance effect element 1 is connected to the drain terminal of the selection transistor 41. The gate terminal of the selection transistor 41 is connected to the word line WL. The source terminal of selection transistor 41 is connected to the bit line /BL.

A row decoder 42 is connected to the word lines WL. A write circuit 44 and read circuit 45 are connected to the bit line pairs BL and /BL. A column decoder 43 is connected to the write circuit 44 and read circuit 45. The row decoder 42 and column decoder 43 select each memory cell MC.

Data is written in the memory cell MC as follows. First, to select a memory cell MC as a data write target, the word line WL connected to the memory cell MC is activated. This turns on the selection transistor 41. In this state, a bidirectional write current Iw is supplied to the magnetoresistance effect element 1 in accordance with write data. More specifically, when supplying the write current Iw to the magnetoresistance effect element 1 from the left to the right in FIG. 13, the write circuit 44 applies a positive voltage to the bit line BL, and the ground voltage to the bit line /BL. When supplying the write current Iw to the magnetoresistance effect element 1 from the right to the left in FIG. 13, the write circuit 44 applies a positive voltage to the bit line /BL, and the ground voltage to the bit line BL. Thus, data "0" or "1" can be written in the memory cell MC.

Next, data read from the memory cell MC is performed as follows. First, to select a memory cell MC as a data read target, the word line WL connected to the memory cell MC is activated. This turns on the selection transistor 41 of the selected memory cell MC. The read circuit 45 supplies a read current Ir flowing from the right to the left in FIG. 13, for example, to the magnetoresistance effect element 1. Based on the read current Ir, the read circuit 45 detects the resistance value of the magnetoresistance effect element 1. Thus, data stored in the magnetoresistance effect element 1 can be read out.

The structure of the MRAM will now be explained. FIG. 14 is a sectional view showing the arrangement of the MRAM in which one memory cell MC is shown in the center.

An element isolation insulating layer 51 is formed in the surface region of a p-type semiconductor substrate 50. The surface region of the semiconductor substrate 50 in which no element isolation insulating layer 51 is formed is an active area where an element is to be formed. The element isolation insulating layer 51 is formed by, e.g., STI (Shallow Trench Isolation). Silicon oxide or the like is used as the STI.

The selection transistor 41 is formed in the active area of the semiconductor substrate 50. The selection transistor 41 includes a source region 52a and drain region 52b spaced apart from each other. Each of the source region 52a and drain region 52b is an n$^+$-type diffusion region formed by heavily doping an n$^+$-type impurity into the semiconductor substrate 50. A gate insulating film 61 is formed on that region of the semiconductor substrate 50, which functions as a channel 53 between the source region 52a and drain region 52b. A gate electrode 62 is formed on the gate insulating film 61. The gate electrode 62 functions as the word line WL.

On the source region 52a, an wiring layer 73 is formed on a contact 72. The wiring layer 73 functions as the bit line /BL. On the drain region 52b, an extraction line 75 is formed on a contact 74. On the extraction line 75, the magnetoresistance effect element 1 sandwiched between a lower electrode 81 and upper electrode 82 is formed. An wiring layer 86 is formed on the upper electrode 82. The wiring layer 86 functions as the bit line BL. Also, the portion between the semiconductor substrate 50 and wiring layer 86 is filled with an interlayer dielectric layer 77 made of, e.g., silicon oxide.

In this embodiment, an MRAM can be fabricated by using the magnetoresistance effect element 1 according to any of the first embodiment and its modifications.

The MRAM of this embodiment includes the magnetoresistance effect element of any of the first embodiment and its modifications as a memory element, and hence is a thermally stable spin transfer torque writing type MRAM having a high heat resistance. This makes it possible to obtain a magnetic memory having a heat resistance higher than those of the conventional memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistance effect element comprising:
   a first magnetic layer having an axis of easy magnetization in a direction perpendicular to a film surface;
   a second magnetic layer having an axis of easy magnetization in a direction perpendicular to a film surface;
   a first nonmagnetic layer formed between the first magnetic layer and the second magnetic layer, an electric current flowing through the first magnetic layer, the first nonmagnetic layer, and the second magnetic layer making a magnetization direction in the first magnetic layer variable;
   a first interface magnetic layer comprising an in-plane magnetization magnetic film formed between the first magnetic layer and the first nonmagnetic layer; and
   a second nonmagnetic layer formed in the first interface magnetic layer and having an amorphous structure, the second nonmagnetic layer dividing the first interface magnetic layer into a lower first interface magnetic layer comprising one part of the in-plane magnetization magnetic film and an upper first interface magnetic layer comprising another part of the in-plane magnetization magnetic film, wherein the upper and lower first interface magnetic layers sandwich the second nonmagnetic layer, and wherein a combination layer of the upper first interface magnetic layer, the lower first interface magnetic layer, and the first magnetic layer has a magnetization direction perpendicular to the film surface.

2. The magnetoresistance effect element according to claim 1, further comprising:
   a second interface magnetic layer formed between the second magnetic layer and the first nonmagnetic layer; and
   a third nonmagnetic layer formed between the second magnetic layer and the second interface magnetic layer, or formed in the second interface magnetic layer, and having an amorphous structure.

3. The magnetoresistance effect element according to claim 1, wherein the second nonmagnetic layer contains at least one element selected from the group consisting of Nb, Si, Ta, and Zr.

4. The magnetoresistance effect element according to claim 1, wherein the third nonmagnetic layer contains at least one element selected from the group consisting of Nb, Si, Ta, and Zr.

5. The magnetoresistance effect element according to claim 1, wherein at least one of the first magnetic layer and the second magnetic layer is made of an ordered alloy containing at least one element selected from the group consisting of Fe, Co, and Ni, and at least one element selected from the group consisting of Pt, Pd, Ru, Ir, and Au.

6. The magnetoresistance effect element according to claim 5, wherein at least one of the first magnetic layer and the second magnetic layer further contains at least one element selected from the group consisting of Cu, Cr, and Ag.

7. The magnetoresistance effect element according to claim 1, wherein at least one of the first magnetic layer and the second magnetic layer is made of a random alloy containing at least one element selected from the group consisting of Fe, Co, and Ni, and at least one element selected from the group consisting of Cr, Ta, Nb, V, W, Hf, Ti, and Zr.

8. The magnetoresistance effect element according to claim 1, wherein at least one of the first magnetic layer and the second magnetic layer has a multilayered structure formed by alternately stacking a first alloy containing at least one element selected from the group consisting of Fe, Co, and Ni, and a second alloy containing at least one element selected from the group consisting of Cr, Pt, Pd, Ir, Rh, Ru, Os, Re, Au, and Cu.

9. The magnetoresistance effect element according to claim 1, wherein the first interface magnetic layer is made of an alloy containing at least one element selected from the group consisting of Fe, Co, and Ni, and at least one element selected from the group consisting of B and Ta.

10. The magnetoresistance effect element according to claim 1, wherein the first interface magnetic layer is made of $(Co_{100-x}-Fe_x)_{100-y}B_y$ (x ≥20 at %, 0<y≤30 at %).

11. A magnetic memory comprising:
a magnetoresistance effect element;
a first electrode and a second electrode configured to supply an electric current to the magnetoresistance effect element;
a first wiring electrically connected to the first electrode;
a second wiring electrically connected to the second electrode; and
a write circuit which is electrically connected to the first wiring and the second wiring; and bidirectionally supplies an electric current to the magnetoresistance effect element, and the magnetoresistance effect element comprising:
a first magnetic layer having an axis of easy magnetization in a direction perpendicular to a film surface;
a second magnetic layer having an axis of easy magnetization in a direction perpendicular to a film surface;
a first nonmagnetic layer formed between the first magnetic layer and the second magnetic layer, an electric current flowing through the first magnetic layer, the first nonmagnetic layer, and the second magnetic layer making a magnetization direction in the first magnetic layer variable;
a first interface magnetic layer comprising an in-plane magnetization magnetic film formed between the first magnetic layer and the first nonmagnetic layer; and
a second nonmagnetic layer formed in the first interface magnetic layer and having an amorphous structure, the second nonmagnetic layer dividing the first interface magnetic layer into an upper first interface magnetic layer comprising one part of the in-plane magnetization magnetic film and a lower first interface magnetic layer comprising another part of the in-plane magnetization magnetic film, wherein the upper and lower first interface magnetic layers sandwich the second nonmagnetic layer, and wherein a combination layer of the upper first interface magnetic layer, the lower first interface magnetic layer, and the first magnetic layer has a magnetization direction perpendicular to the film surface.

12. The magnetic memory according to claim 11, further comprising:
a selection transistor connected between the second electrode and the second wiring; and
a third wiring configured to control ON/OFF of the selection transistor.

* * * * *